(12) United States Patent
Cho

(10) Patent No.: US 12,117,470 B2
(45) Date of Patent: Oct. 15, 2024

(54) ANALYSIS DEVICE BASED ON POWER CONSUMPTION INFORMATION ABOUT TREADMILL

(71) Applicant: Hyun Sang Cho, Seoul (KR)

(72) Inventor: Hyun Sang Cho, Seoul (KR)

( * ) Notice: Subject to any disclaimer, the term of this patent is extended or adjusted under 35 U.S.C. 154(b) by 348 days.

(21) Appl. No.: 17/594,323

(22) PCT Filed: Apr. 8, 2020

(86) PCT No.: PCT/KR2020/004740
§ 371 (c)(1),
(2) Date: Oct. 11, 2021

(87) PCT Pub. No.: WO2020/209595
PCT Pub. Date: Oct. 15, 2020

(65) Prior Publication Data
US 2022/0163575 A1 May 26, 2022

(30) Foreign Application Priority Data
Apr. 12, 2019 (KR) .................. 10-2019-0043344

(51) Int. Cl.
*G01R 21/06* (2006.01)
*A63B 22/02* (2006.01)
(Continued)

(52) U.S. Cl.
CPC .............. *G01R 21/06* (2013.01); *A63B 22/02* (2013.01); *A63B 24/00* (2013.01);
(Continued)

(58) Field of Classification Search
CPC ...... G01R 21/06; G01R 21/006; G01R 19/04; A63B 22/02; A63B 24/00; A63B 24/0059;
(Continued)

(56) References Cited

U.S. PATENT DOCUMENTS

2017/0266535 A1* 9/2017 Watterson .......... A63B 22/0242
2018/0028896 A1* 2/2018 Ray ........................ H04N 7/183
(Continued)

FOREIGN PATENT DOCUMENTS

| JP | 2011050451 A * | 8/2009 | ............... A61B 5/11 |
| KR | 100819205 B1 | 4/2008 | |

(Continued)

*Primary Examiner* — Andrew S Lo
*Assistant Examiner* — Andrew M Kobylarz
(74) *Attorney, Agent, or Firm* — Honigman LLP; Brett A. Krueger

(57) ABSTRACT

The present disclosure provides an analysis device based on power consumption information about a treadmill. The analysis device includes: a current sensor configured to sense, in real time, a change in instantaneous current generated in the treadmill due to a variation in a load of an electric motor in a case in which a belt of the treadmill is driven while repeating rotational motion at a predetermined speed and an object to be measured exercises while stepping the belt according to the predetermined speed; and a processor configured to determine a movement pattern of the object to be measured based on a value of the change in instantaneous current sensed by the current sensor. Thus, it is possible to monitor a health status of the object to be measured.

8 Claims, 10 Drawing Sheets

(51) Int. Cl.
*A63B 24/00* (2006.01)
*A63B 71/06* (2006.01)
*G06F 3/14* (2006.01)

(52) U.S. Cl.
CPC ............ *A63B 24/0059* (2013.01); *G06F 3/14* (2013.01); *A63B 24/0062* (2013.01); *A63B 2024/0093* (2013.01); *A63B 71/0622* (2013.01); *A63B 2071/0638* (2013.01); *A63B 2220/80* (2013.01)

(58) Field of Classification Search
CPC ............ A63B 24/0062; A63B 71/0622; A63B 2024/0093; A63B 2071/0638; A63B 2220/80; A63B 22/0235; A63B 24/0075; G06F 3/14
See application file for complete search history.

(56) References Cited

U.S. PATENT DOCUMENTS

| | | | | |
|---|---|---|---|---|
| 2019/0329091 | A1* | 10/2019 | Powell | A63B 22/0235 |
| 2020/0332990 | A1* | 10/2020 | Bayerlein | A63B 22/02 |
| 2021/0170222 | A1* | 6/2021 | Consiglio | A63B 21/225 |
| 2021/0346754 | A1* | 11/2021 | Brunner | A63B 24/0087 |
| 2023/0280828 | A1* | 9/2023 | Fung | A61B 5/4842 |

FOREIGN PATENT DOCUMENTS

| | | | | |
|---|---|---|---|---|
| KR | 20090129077 | * | 6/2008 | ............ A63B 24/00 |
| KR | 1020090129077 A | | 2/2011 | |
| KR | 101259039 | * | 4/2011 | ............ A63B 22/02 |
| KR | 101259039 B1 | | 4/2013 | |
| KR | 1020130048358 A | | 5/2013 | |
| KR | 1020140120545 A | | 10/2014 | |

* cited by examiner

ANALYSIS DEVICE BASED ON POWER CONSUMPTION INFORMATION ABOUT TREADMILL

TECHNICAL FIELD

The present disclosure relates to a device which monitors a power consumption of a treadmill while driven separately from the treadmill.

BACKGROUND

Treadmills are machines that provide a moderate amount of exercise and provide an amount of exercise substantially similar to that of walking or running exercise in the outdoor. That is, a user's sufficient exercise is possible also in the indoor by the continuous use of treadmills.

Here, when exercising using treadmills, repetitive motions such as spinning a treadmill may reduce interest in exercise and motivation to continue exercising.

In addition, when exercising using a treadmill, although exercise is performed at a predetermined speed for a predetermined amount of time, and a user can estimate how many calories he/she burns in correspondence with an amount of the exercise, it can be said that it is somewhat insufficient to monitor a health status through quantitative evaluation of gait.

Thus, it is necessary to come up with a technique for solving the aforementioned problems.

On the other hand, the above description is merely presented as background information provided for the sake of easier understanding of the present disclosure. A determination is not provided as to whether or not the above description can be applied as a prior art related to the present disclosure and an assertion is not provided.

PRIOR ART DOCUMENT

Patent Document

Patent Document 1: Korean Unexamined Patent Application Publication No. 10-2013-0048358 (Published date: May 10, 2013)

SUMMARY

The present disclosure was devised to solve the above problems, and an embodiment of the present disclosure proposes a device which determines a movement pattern of a walker or a runner based on power consumption information about a treadmill.

Further, an embodiment of the present disclosure provides a device which performs a medical diagnosis using walking information and prescribes a more sophisticated exercise therapy according to the result of the diagnosis.

The technical problems to be achieved in the present disclosure are not limited to the technical problems described above, and other technical problems not mentioned will be clearly understood by those skilled in the art from the following description.

An analysis device based on power consumption information about a treadmill according to one embodiment of the present disclosure, may include: a current sensor configured to sense, in real time, a change in instantaneous current generated in the treadmill due to a variation in a load of an electric motor in a case in which a belt of the treadmill is driven while repeating rotational motion at a predetermined speed and an object to be measured exercises while stepping the belt according to the predetermined speed; and a processor configured to determine a movement pattern of the object to be measured based on a value of the change in instantaneous current sensed by the current sensor.

In some embodiments, the processor may determine the movement pattern of the object to be measured based on a form of an envelope of a current signal corresponding to one step of the object to be measured and a waveform inside the envelope.

More specifically, the processor may determine the movement pattern (MP) of the object to be measured based on the following equation 1, $$MP = (PV \text{ to Peak})/(\text{Peak to } NV) \quad \text{[Equation 1]}$$

(where "Peak" indicates a maximum value of an instantaneous current in an envelope, "PV (previous valley)" is a minimum value before a maximum value, "NV (next valley)" is a minimum value after a maximum value, "PV to Peak" is a relative distance from PV to Peak, and "Peak to NV" is a relative distance from Peak to NV), and the processor may determine that the object to be measured is walking when a value of the MP is smaller than a value $\rho$, and determines that the object to be measured is running when the value of the MP is larger than a value $\tau$.

In some embodiments, when an intensity of a value of an instantaneous current of a first foot of the object to be measured and an intensity of a value of an instantaneous current of a second foot of the object to be measured have a constant difference within a predetermined range, the processor may determine that the first foot is in an abnormal state.

The analysis device may further include a voltage sensor, and the processor may calculate a power and a power factor of the treadmill based on a current value sensed by the current sensor and a voltage value sensed by the voltage sensor.

In some embodiments, the processor may adjust a driving speed and a driving time of the treadmill to meet a condition of the object to be measured and configured to determine a physical fitness state corresponding to a maximum possible exercise capacity of the object to be measured.

The analysis device may further include a display having a curved-surface and provided in a front of the treadmill to inspire motivation to exercise of the object to be measured, and the processor may provide, through the display, an image of an interactive game of a tourist destination in which an advertisement is included based on a health status obtained by an analysis of a walking pattern of the object to be measured, and may be configured to output a wind or generate a fragrant smell.

In some embodiments, the analysis device may further include an adaptor having one end connected to an outlet for an external power supply and the other end connected to a power supply cable of the treadmill and configured to supply power from the external power supply to the treadmill.

In some embodiments, when the object to be measured is a person who has symptoms of diseases on his/her joint and/or nerve system, and/or improper walking habit especially for an old person who exceeds a predetermined age, the processor may perform a medical diagnosis based on the movement pattern of the object to be measured.

According to various embodiments of the present disclosure, it is possible to perform a medical diagnosis on whether an abnormality has occurred in a musculoskeletal system of a user without remodeling the treadmill, and analyze a health status of the user.

The effects that can be obtained in the present disclosure are not limited to the aforementioned effects, and other effects not mentioned will be clearly understood by those skilled in the art from the following description.

DETAILED DESCRIPTION

Various embodiments of the present disclosure will be described in more detail below with reference to the accompanying drawings. Here, in the description of the present disclosure, when it is determined that a detailed description of a related known function or configuration may unnecessarily obscure the gist of the present disclosure, the detailed description thereof will be omitted.

Figure 1:
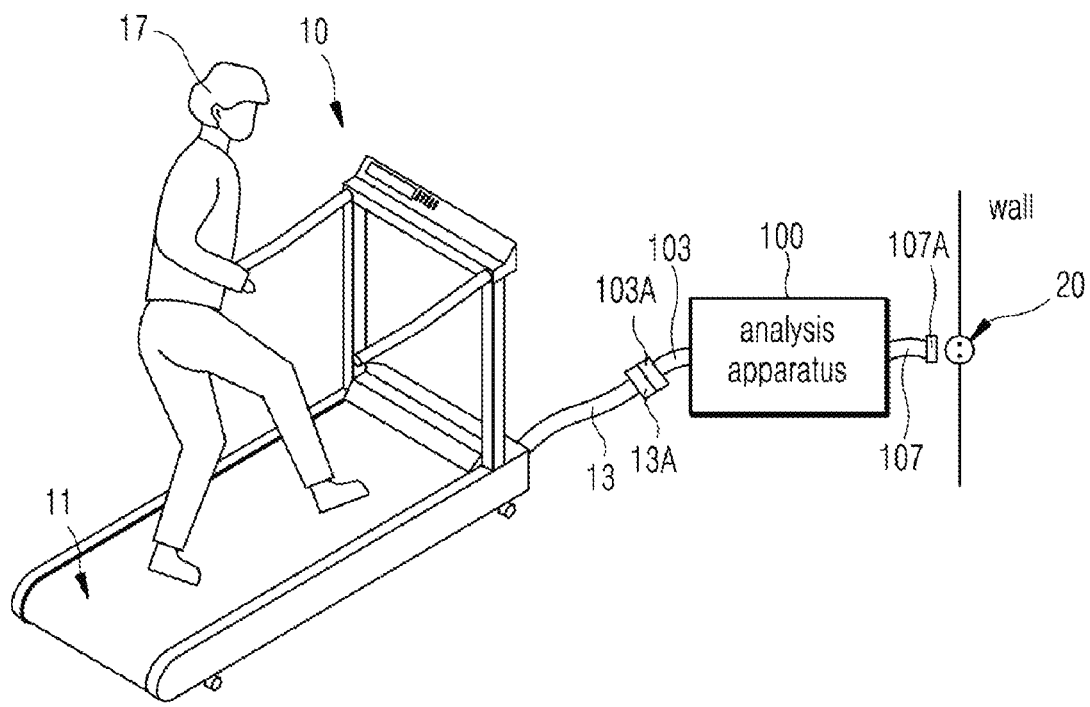
FIG. 1 is a view for schematically explaining an analysis device based on power consumption information about a treadmill according to an embodiment of the present disclosure.

FIG. 1 is a diagram for schematically explaining an analysis device 100 (hereinafter referred to as an "analysis device") based on power consumption information about a treadmill according to an embodiment of the present disclosure.

Referring to FIG. 1, a user 17 is exercising on a treadmill 10. The treadmill 10 includes a belt 11 configured to repeat a rotational motion. The belt 11 may be driven using an electric motor. That is, the treadmill 10 provides an environment in which the user 17 can walk or run on the treadmill 10 at a set speed.

One end of the analysis device 100 may include a cable 107 and a plug 107A, be connected through an external power supply and an outlet 20, and receive external power. The other end of the analysis device 100 may be connected to a plug 13A of the treadmill 10 through a cable 103 and a plug 103A in an adapter manner. Thus, the analysis device 100 may be provided separately from the treadmill 10 to measure power consumed by the treadmill 10. That is, the analysis device 100 may be connected to the treadmill 10 without remodeling the treadmill 10.

Figure 2:
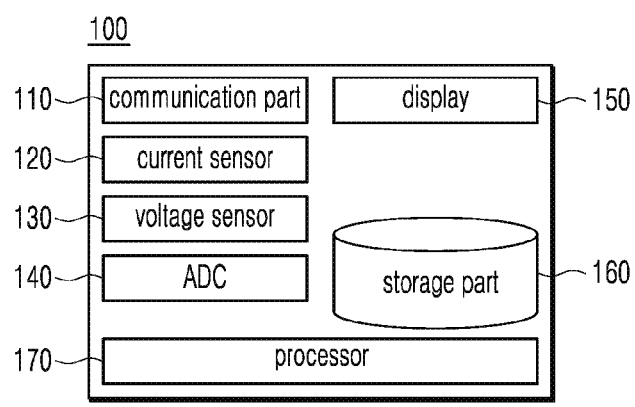
FIG. 2 is a block diagram illustrating a configuration of the analysis device based on power consumption information about a treadmill according to an embodiment of the present disclosure.

A configuration of the analysis device 100 will be described below with reference to FIG. 2, description is provided with reference to reference numerals in FIG. 1 as well.

The analysis device 100 includes a communication part 110, a current sensor 120, a voltage sensor 130, an analog-digital converter (ADC) 140, a display 150, a storage part 160, and a processor 170 configured to control these parts.

The communication part 110 may include a wired/wireless communication module, a near field communication module, a mobile communication module, or the like and may communicate with a terminal device, an external apparatus, and a system through such a module.

The current sensor 120 may measure a value of an instantaneous current generated from the treadmill 10. A constituent element that consumes the biggest power in the treadmill 10 is an electric motor for rotating the belt 11 of the treadmill 10 repeatedly. Power consumed by modules that perform other electronic control is small or is kept constant within a predetermined range. Thus, a current signal generated from the electric motor can be separately monitored. That is, the current sensor 120 may monitor, in real time, a change in instantaneous current generated due to a load variation of the electric motor.

A variety of elements may be applied to the current sensor 120. As an example, a shunt register may be applied to the current sensor 120 to precisely monitor a change per cycle in an alternating current (AC) having a period of $\frac{1}{60}$ seconds at a sufficient sampling period.

The voltage sensor 120 is a module configured to measure an amount of voltage to be applied to the treadmill 10. The processor 170 may calculate the power consumed by the treadmill 10 based on the current value collected from the current sensor 120 and the amount of voltage measured by voltage sensor 120. Further, the processor 170 may accurately calculate power of an AC circuit by calculating a power factor that is a ratio of an active power to an apparent electric power in the AC circuit.

The ADC 110 is used for the purpose of convert an analog signal of a measured current into a digital signal which can be easily processed by the processor 170 in an analog-to-digital manner. A circuit provided with various elements such as a rectifier and an amplifier may be applied to the analysis device 100, in addition to the ADC 110.

The display 150 may be separately provided in the analysis device 100 and be realized in the form of a large curved surface in front of the treadmill 10, or smartphone, TV, holography, VR, AR, or any sort of visual/auditory/olfactory/tactile display to inspire motivation to exercise of an object to be measured. The processor 170 may provide various images, information, and the like to the object to be measured based on a health status of the object to be measured.

The display 150 may display an image such as an interactive game or a tourist destination which has advertisements or additional information and through which the user can interact with the analysis device 100 under the control of the processor 170.

The processor 170 may provide a benefit distribution or separate tangible and intangible rewards to a game participant using the treadmill 10 through a contract with an advertiser.

To this end, the processor 170 may provide a reward to a game participant who uses the treadmill 10 from the costs paid by the advertiser for the advertisement based on information about a degree of participation in which the game participant's treadmill usage time, number of advertisement views, advertisement viewing time, and the like are taken into account.

The processor 170 may provide a discounted item on the game or provide an item for free, and may pay cash or various rewards outside of the game.

The storage part 160 may store various information under the control of the processor 170. The storage part 160 may include a storage medium having at least one of a flash memory type, a hard disk type, a solid state disk (SSD) type, a silicon disk drive (SDD) type, a multimedia card micro type, a card-type memory (for example, an SD or an XD memory), a random access memory (RAM), a static random access memory (SRAM), a read-only memory (ROM), an electrically erasable programmable read-only memory (EEPROM), a programmable read-only memory (PROM), a magnetic memory, a magnetic disk, and an optical disk, and may also include a storage such as a cloud system.

In some embodiments, the treadmill 10 may include a module configured to output wind or a module configured to emit a fragrant smell, which is provided separately from the above-described constituent elements, and may perform a specific operation under the control of the processor 170.

When the belt 11 of the treadmill 10 is driven while repeating the rotational motion at a predetermined rotational speed, and the object to be measured exercises while stepping on the belt 11 in accordance with the speed, the processor 170 may detect a value sensed using the current sensor 120 or the voltage sensor 130.

The processor 170 may transmit or receive information through an external device (smartphone, server, personal computer (PC), or the like) and the communication part 110 based on the collected information.

The processor 170 may determine a movement pattern of the object to be measured based on the current value sensed by the current sensor 120.

Graphs derived using the processor 170 to determine movement pattern of the object to be measured based on the current value sensed by the current sensor 120 will be described below with reference to FIG. 3 to FIG. 7B.

Figure 3:
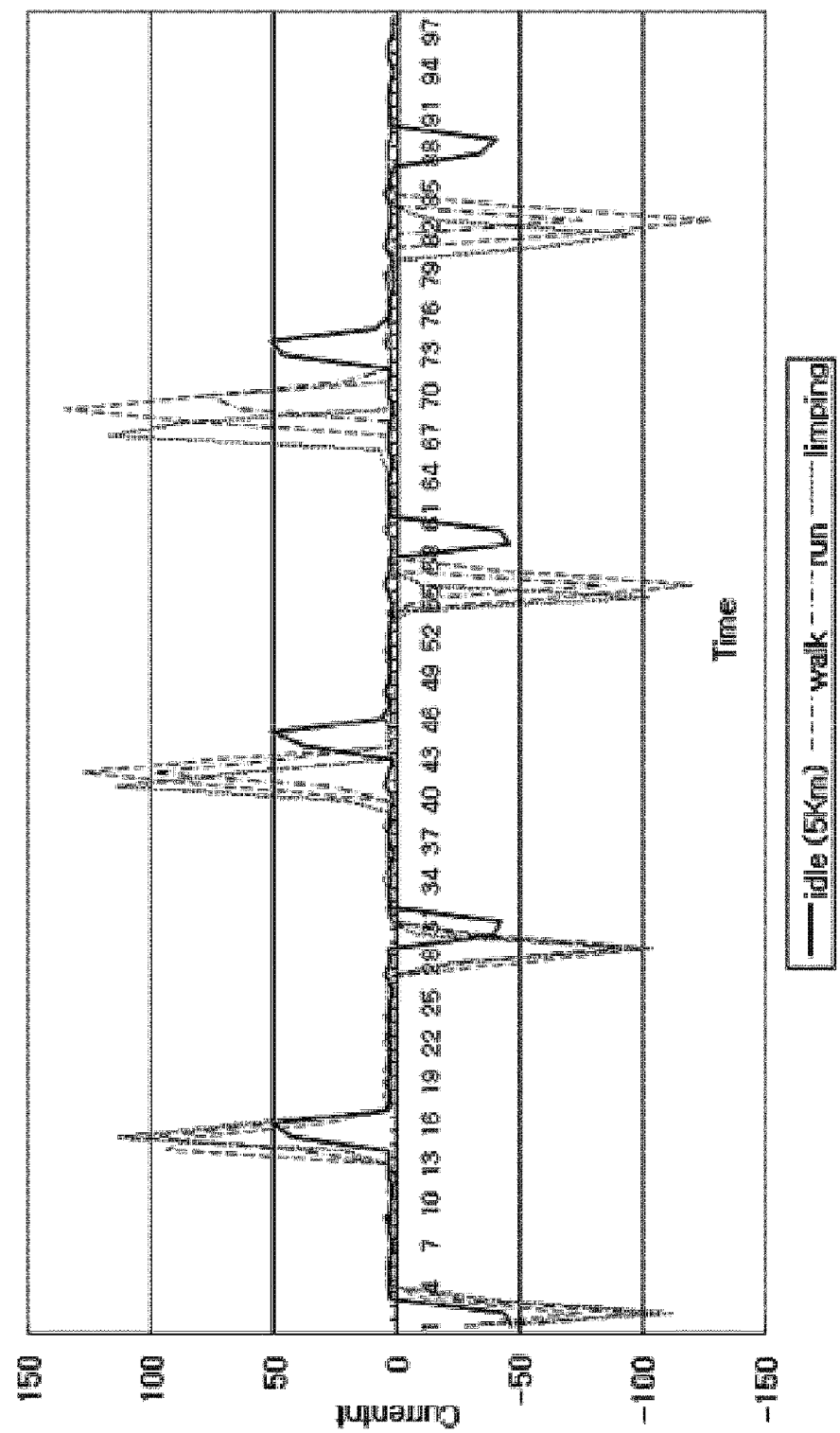
FIG. 3 to FIG. 7B are graphs generated to determine a movement pattern of a user in the analysis device based on power consumption information about a treadmill according to an embodiment of the present disclosure.

First, FIG. 3 is a graph illustrating current values measured for a predetermined period of time when a direct current (DC) motor is applied to the treadmill 10 according to an embodiment of the present disclosure.

Referring to FIG. 3, the analysis device 100 may display current values consumed in an idle state, a walking state, a running state, and a limping running state using a sample sufficient to monitor a change in AC current of 60 Hz (or 50 Hz).

In the example of the DC motor of the treadmill 10, an amount of power to be supplied is controlled to control a speed of the DC motor by using a manner similar to a pulse width modulation (PWM) which uses, only partially within one cycle, the AC power supply in which a sine wave repeats certain times (50 or 60) per second. Each peak point indicates a point in the sine wave in which power is actually supplied to the electric motor. Further, a change in current due to the load may also be monitored for the AC motor in the same manner regardless of driving method.

Referring to FIG. 3, since an amount of impact in the running state is the greatest, it is observed that when a more load is applied to the electric motor, an amount of current consumed by the electric motor is higher than those in the other states (walking state and limping state). In the case of the limping state in which the belt 11 is lightly touched due to pain in the foot, an amount of impact is observed to be less than that in the running state.

Figure 4A:
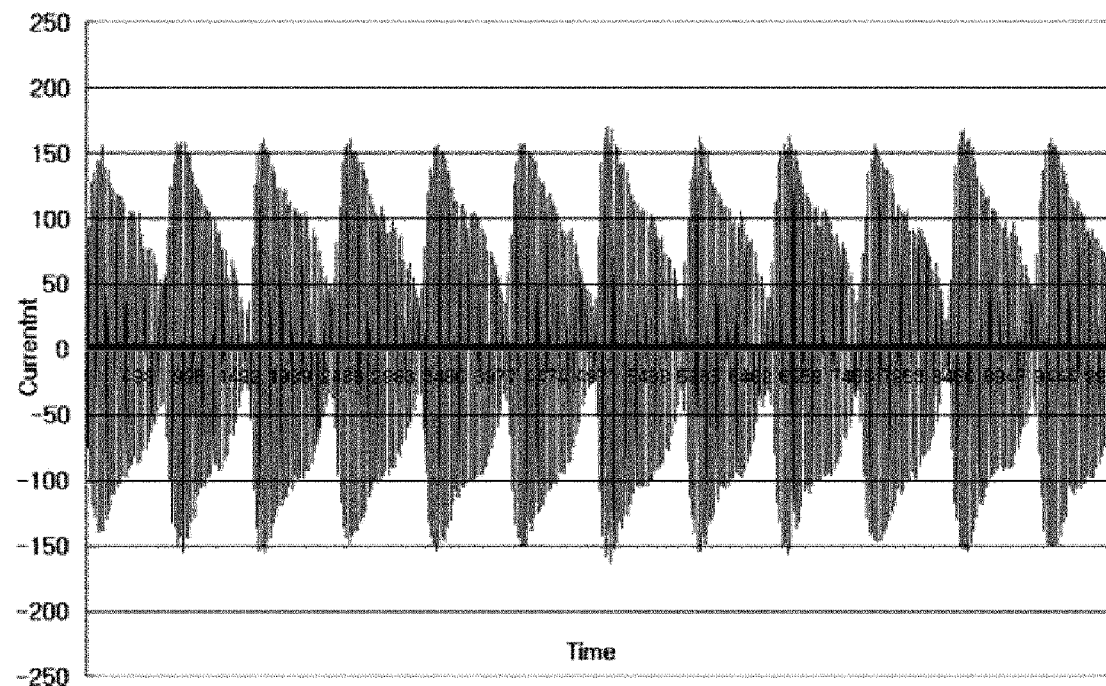
Figure 4B:
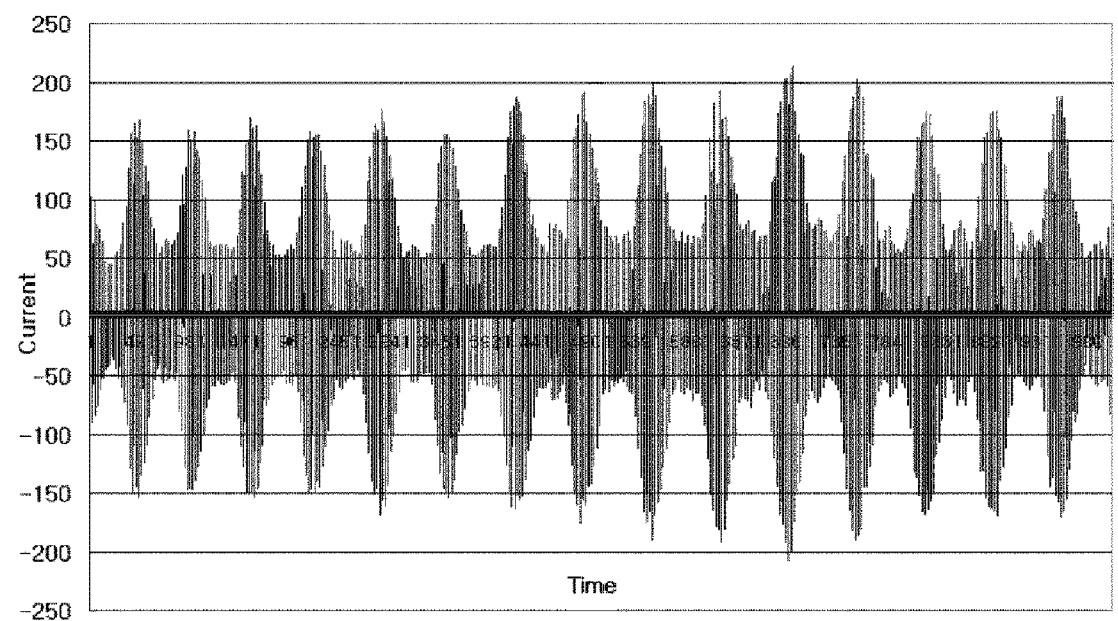
Figure 4C:
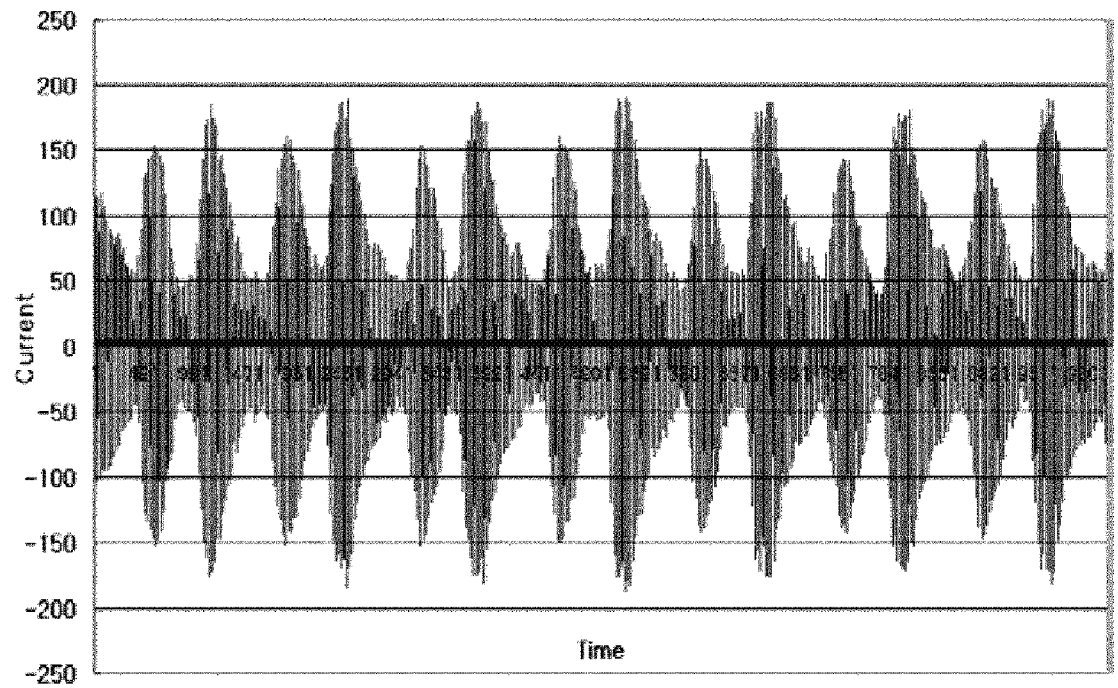

FIG. 4A illustrates current values measured by the analysis device 100 according to an embodiment of the present disclosure in the case of the walking state, FIG. 4B illustrates current values by the analysis device 100 according to an embodiment of the present disclosure in the case of the running state, and FIG. 4C illustrates current values measured by the analysis device 100 according to an embodiment of the present disclosure in the case of the limping state.

Referring to FIG. 4A, the number of steps measured by the analysis device 100 is 12 for 10 seconds. When looking at each step, the force value rapidly increases the moment the heel touches a pad of the belt 11, and the ball of his/her foot pushes the pad away so that an incline is formed until the moment the foot leaves the pad. In such a case, the analysis device 100 may determine that the walker is walking.

Referring to FIG. 4B, the number of steps measured by the analysis device 100 is 16 for 10 seconds. When looking at each step, impact at the moment when the ball of his/her foot touches the pad of the belt 11, pushes the pad, and then leaves the pad is very large, whereas slopes on front and back sides until the ball of his/her foot touches the pad and then leaves the pad are symmetrical with each other. In such a case, the analysis device 100 may determine that the walker is running.

Referring to FIG. 4C, the number of steps measured by the analysis device 100 is 15 for 10 seconds. Since the left foot and the right foot repeatedly touches the pad during the walking, a current value of one step is observed to be constantly smaller than that of another step. In such a case, the analysis device 100 may determine that the walker has a disability in the his/her one leg.

Referring to FIGS. 4A to 4C, the analysis device 100 can accurately measure a walking state, a running state, lameness, or the like of the walker using the treadmill 10.

Figure 5:
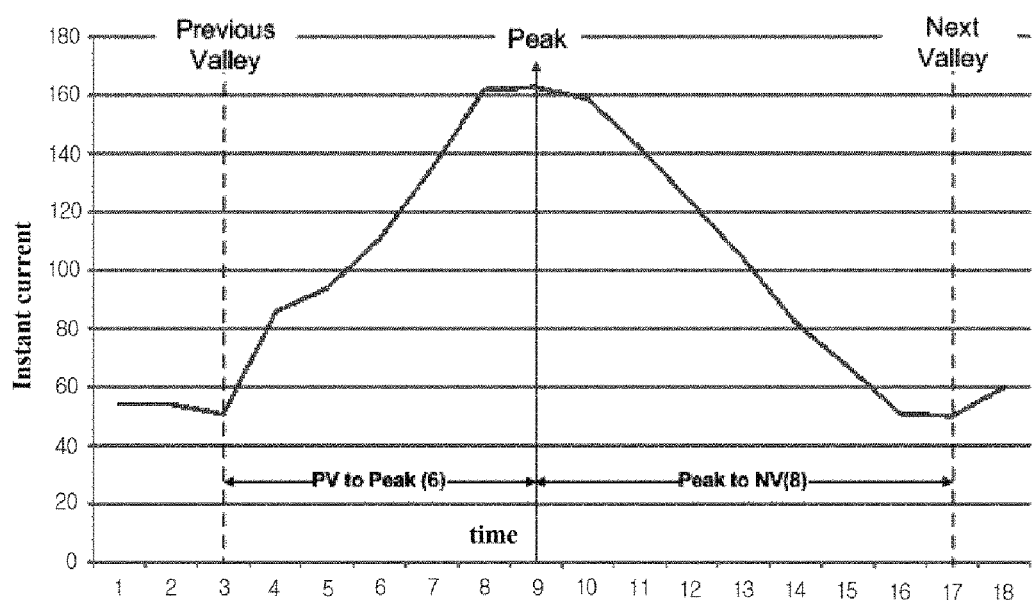

FIG. 5 is a diagram for explaining a method in which the analysis device 100 according to an embodiment of the present disclosure determines a movement pattern of an object to be measured using an envelope and a waveform inside the envelope in one step. An envelope in contact with a instantaneous current value graph in the graphs illustrated in FIGS. 4A to 4C may be derived. FIG. 5 illustrates the envelope for one step. Here, one step is a step when repeatedly exercises in a constant pattern, not a step when exercising in an irregular pattern.

Referring to FIG. 5, here, the "Peak" indicates a maximum value of the instantaneous current in the envelope, "Previous Valley (PV)" is a minimum value before a maximum value, "Next Valley (NV)" a minimum value after a maximum value, "PV to peak" is a relative distance from PV to Peak, and "Peak to NV" is a relative distance from Peak to NV.

That is, the analysis device 100 determines that the object to be measured is walking when MP (pattern determination value) derived by the following Equation 1 is smaller than a value $\rho$, and determines that the object to be measured is running when the MP is larger than a value $\tau$. The value $\rho$ may be set to 0.5 and the value $\tau$ may be set to 0.6. Here, these values $\rho$ and $\tau$ may be changed according to an implementation example.

$$MP = (PV \text{ to Peak})/(Peak \text{ to } NV) \qquad \text{[Equation 1]}$$

In this case, when an intensity of an instantaneous current value of one foot of the object to be measured and an intensity of an instantaneous current value of the other foot thereof have a constant difference within a predetermined range, the processor 170 may determine that one of these feet is in an abnormal state.

Figure 6A:
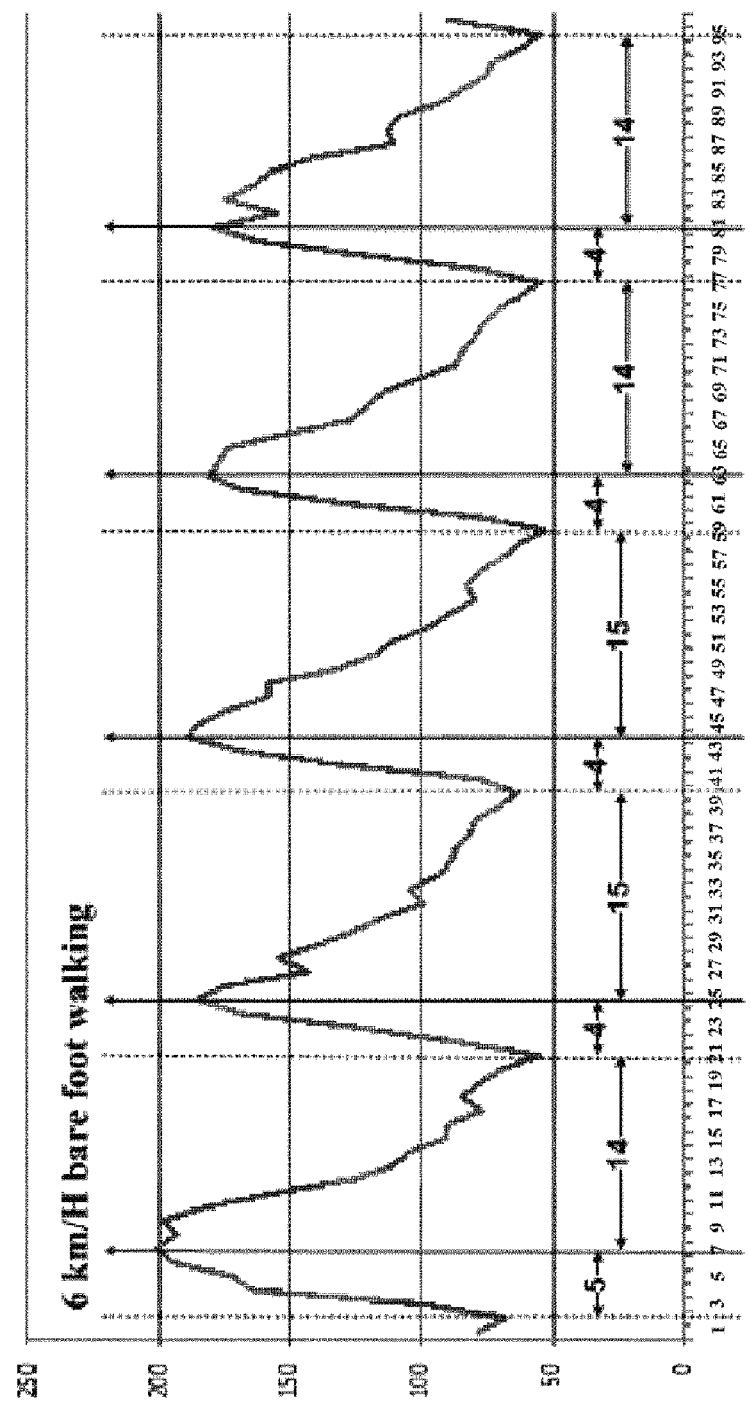
Figure 6B:
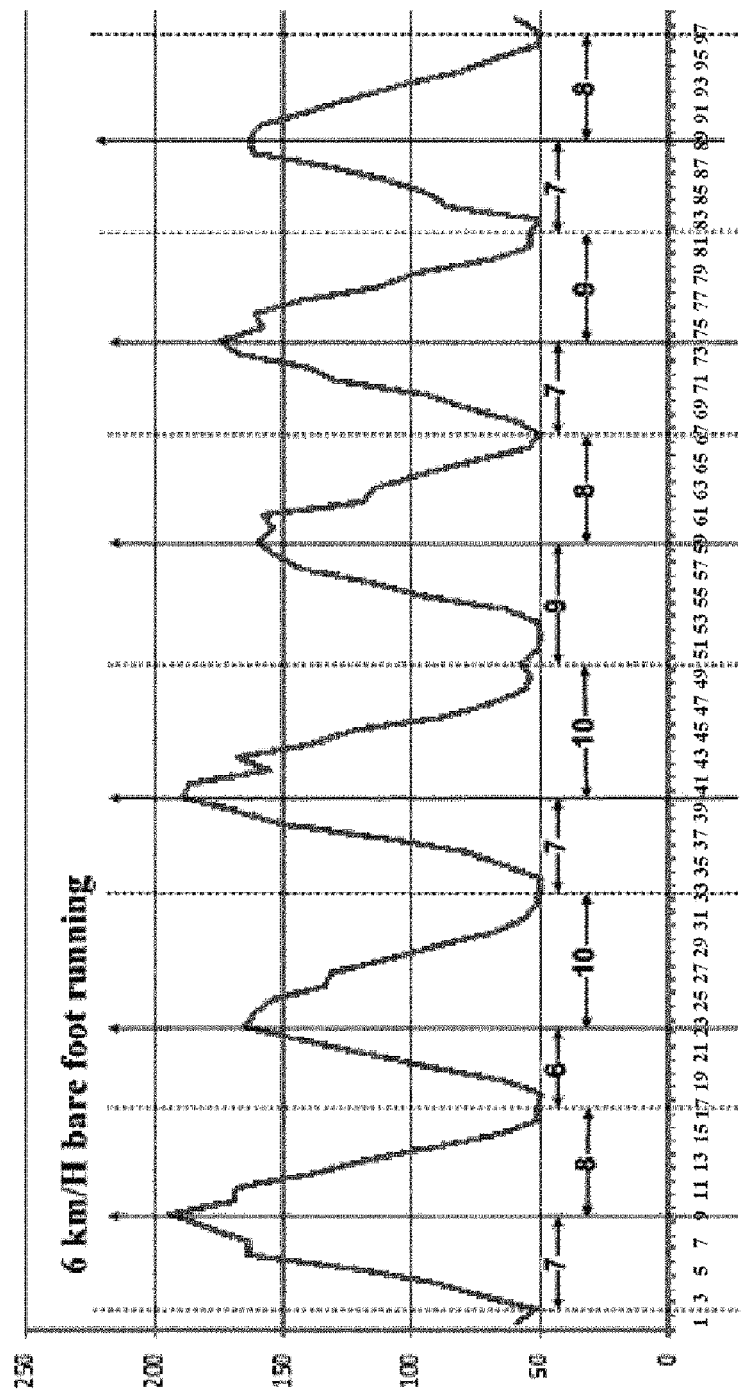
Figure 6C:
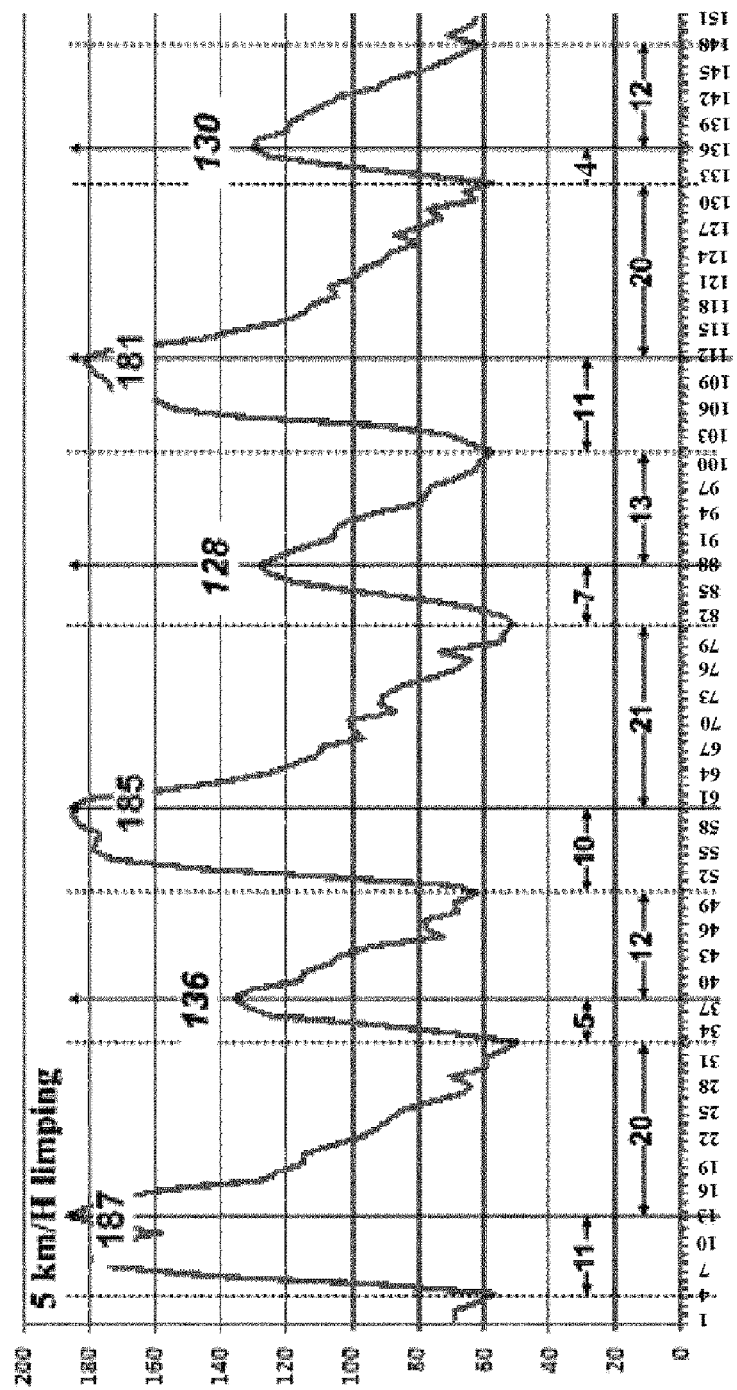

FIG. 6A illustrates an envelope for current values measured by the analysis device 100 according to an embodiment of the present disclosure in the case of the walking state, FIG. 6B illustrates an envelope for current values measured by the analysis device 100 according to an embodiment of the present disclosure in the case of the running state, and FIG. 6C illustrates an envelope for current values measured by the analysis device 100 according to an embodiment of the present disclosure in the case of the limping state.

Referring to FIG. 6A, the analysis device 100 determines that the walker is walking because the values MP for a total of five steps are 0.36, 0.27, 0.27, 0.29, and 0.29, respectively.

Referring to FIG. 6B, the analysis device 100 determines that the walker is running because the values MP for a total of six steps are 0.875, 0.6, 0.7, 1.125, 0.78 and 0.875, respectively.

Referring to FIG. 6C, the analysis device 100 may determine that the walker's one foot is in an abnormal state because the values MP for a total of six steps are 0.55, 0.41, 0.48, 0.53, 0.55 and 0.33, respectively, and a ratio of one step to the other step is 0.71.

Figure 7A:
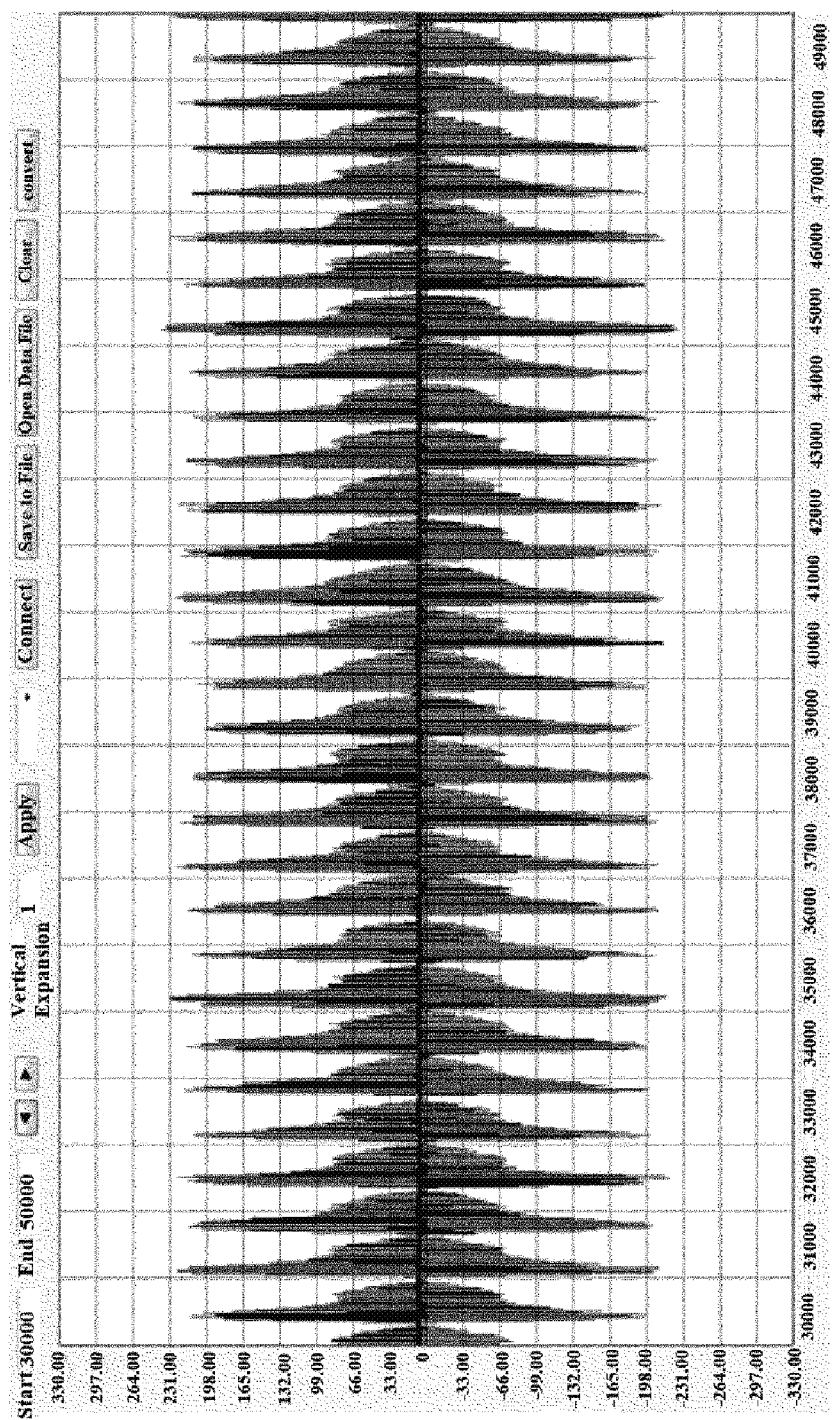
Figure 7B:
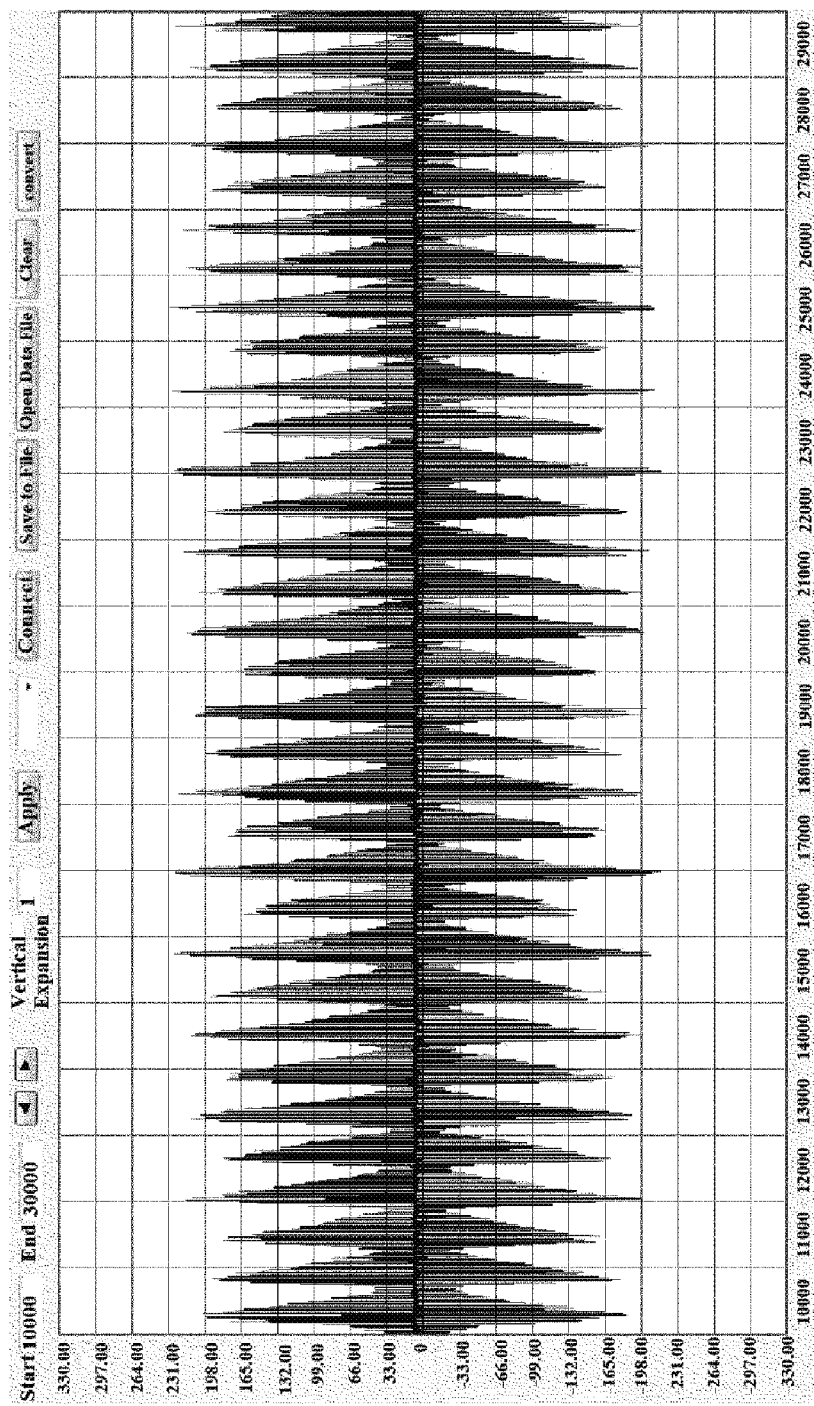

FIGS. 7A and 7B illustrate walking patterns analyzed by the analysis device 100 in the case in which the walker wears the shoes (FIG. 7A) and takes off the shoes (FIG. 7B).

Referring to FIG. 7A, when the walker wears the shoes, a sharp stepped portion may occur at a portion in which one shoe touches the pad of the analysis device 100 and the shoe portion corresponding to the ball of his/her foot pushes the pad. The portion may be a stepped portion occurring when the sole and the pad cannot transmit the movement of the ball of his/her foot inside the shoe to the pad before the ball of his/her foot pushes the pad and the pad is suddenly pushed together with the hard bottom of the shoe. Such a stepped portion does not occur when the walker does not wear the shoes (FIG. 7B).

The analysis device 100 may transmit information obtained through the analysis to an external smartphone, an external medical institution outside of a server, a healthcare professional institution, and the like through the communication part 110. The analysis device 100 may also transmit comments provided from the healthcare professional institution or a medical professional to the walker again in a feed-back manner.

The analysis device 100 may adjust a driving speed and a driving time of the treadmill 10 to meet a condition of the object to be measured and may determine a physical fitness state based on a maximum possible exercise capacity of the object to be measured. That is, the analysis device 100 may automatically adjust an amount of exercise using a reaction limit as described above. Thus, the analysis device 100 may provide a customized exercise therapy or the like for each walker.

Further, when the object to be measured is an old man (or woman) who exceeds a predetermined age (for example, 70 years old) or a patient with joint disease, the analysis device 100 may perform a medical diagnosis based on a movement pattern of the object to be measured. That is, the analysis device 100 may perform the medical diagnosis for joint disease based on only the motion of the walker on the treadmill 10.

Figure 8:
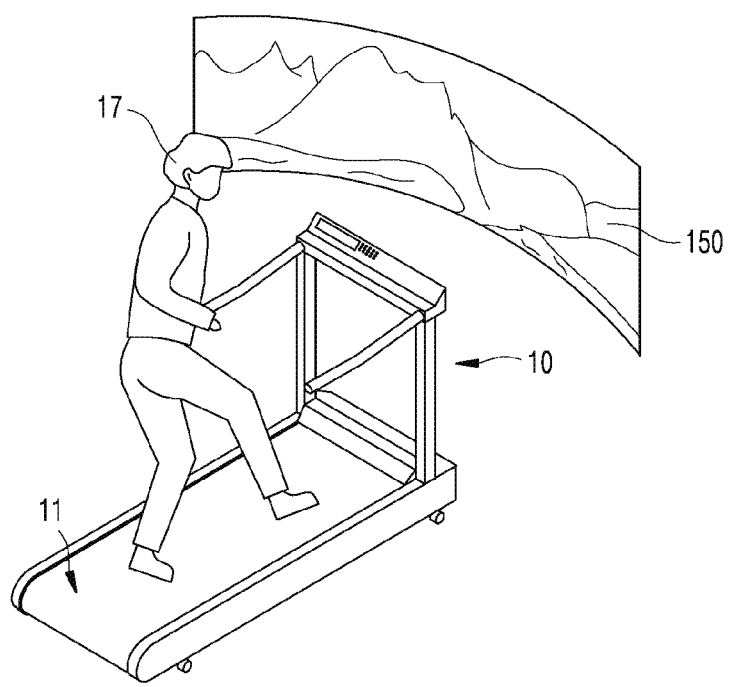
FIG. 8 illustrates an external form of the analysis device based on power consumption information about a treadmill for encouraging exercise continuation according to an embodiment of the present disclosure.

FIG. 8 illustrates an analysis device 100 which enhances motivation to continuously exercise according to an embodiment of the present disclosure.

The analysis device 100 may include a large curved-surface display 150 for a walker. The curved-surface display 150 may display walker-friendly sceneries, an interactive game using the treadmill 10 as an adjustment interface, an exercise image including an advertisement image, or the like.

Further, the analysis device 100 may support a game function of providing an interface through which the walker can experience virtual reality, an augmented reality, or the like while exercising on the treadmill 10. In this case, a 3D glass or the like may also be used in the analysis device 100.

The analysis device 100 may analyze information about the number of steps performed for each minute, information about symmetry between left and right feet, information about whether the walker is adapting to the respective speed with ease, and the like, and may visually and audibly provide these pieces of information to the walker in the middle of exercise. As an example, a notification may be provided with an LED or a specific sound may be generated.

The embodiments according to the present disclosure as described above may be implemented in the form of program instructions that can be executed by various computer components, and may be stored on a computer-readable recording medium. The computer-readable recording medium may include program instructions, data files, and data structures, separately or in combination. The program instructions stored on the computer-readable recording medium may be specially designed and configured for the present disclosure, or may also be known and available to those skilled in the computer software field. Examples of the computer-readable recording medium include the following: magnetic media such as hard disks, floppy disks and magnetic tapes; optical media such as compact disk-read only memory (CD-ROM) and digital versatile disks (DVDs); magneto-optical media such as floptical disks; and hardware devices such as read-only memory (ROM), random access memory (RAM) and flash memory, which are specially configured to store and execute program instructions. Examples of the program instructions include not only machine language codes created by a compiler, but also high-level language codes that can be executed by a computer using an interpreter. The above hardware devices may be changed to one or more software modules to perform the processes of the present disclosure, and vice versa.

Although various preferable embodiments have been described in detail above, the present disclosure is not limited to the embodiments described above, and various modifications and changes may be made by a person of ordinary skill in the art without departing from the scope and technical spirit of the present disclosure.

INDUSTRIAL APPLICABILITY OF THE PRESENT DISCLOSURE

The present disclosure can be effective in determining a movement pattern of a walker or a runner based on power consumption information about a treadmill, and practicing clearly and realistically not only use in the related art but also the marketing or business of the applied device at a sufficient level by overcoming the limitations in the related art. Thus, the present disclosure has industrial applicability.

What is claimed is:

1. An analysis device based on power consumption information about a treadmill, comprising:
   a current sensor configured to sense, in real time, a change in instantaneous current generated in the treadmill due to a variation in a load of an electric motor in a case in which a belt of the treadmill is driven while repeating a rotational motion at a predetermined speed and an object to be measured exercises by stepping on the belt according to the predetermined speed; and
   a computer processor configured to determine a movement pattern of the object to be measured based on a value of the change in instantaneous current sensed by the current sensor,
   wherein the computer processor is configured to determine the movement pattern of the object to be measured based on a form of an envelope of a current signal corresponding to one step of the object to be measured and a waveform inside the envelope, wherein the computer processor is configured to determine the movement pattern (MP) of the object to be measure based on the following equation1, MP=(PV to Peak)/(Peak to NV) [Equation 1], wherein "Peak" indicates a maximum value of an instantaneous current in an envelope, "PV (previous valley)" is a minimum value before a maximum value, "NV (next valley)" is a minimum value after a maximum value, "PV to Peak" is a relative distance from PV to Peak, and "Peak to NV" is a relative distance from Peak to NV), and wherein the computer processor is configured to determine that the object to be measured is walking when a value of the MP is smaller than a value p, and determine that the object to be measured is running when the value of the MP is larger than a value T.

2. The analysis device of claim 1, wherein when an intensity of a value of an instantaneous current of a first foot of the object to be measured and an intensity of a value of an instantaneous current of a second foot of the object to be measured have a constant difference within a predetermined range, the computer processor is configured to determine that the first foot is in an abnormal state.

3. The analysis device of claim 1, further comprising: a voltage sensor, wherein the computer processor is configured to calculate a power and a power factor of the treadmill based on a current value sensed by the current sensor and a voltage value sensed by the voltage sensor.

4. The analysis device of claim 1, wherein the computer processor is configured to adjust a driving speed and a driving time of the treadmill to meet a condition of the object to be measured and configured to determine a physical fitness state corresponding to a maximum possible exercise capacity of the object to be measured.

5. The analysis device of claim 4, further comprising:

a display provided in a front of the treadmill or attached to a user to inspire motivation to exercise of the object to be measured, wherein the computer processor is configured to provide, through the display, an image of an interactive game or a tourist destination in which an advertisement is included based on a health status obtained by an analysis of a walking pattern of the object to be measured, and the computer processor is configured to output a wind or generate a fragrant smell, and provide a differential reward to the object to be measured based on a degree of participation to the interactive game of the object to be measured.

6. The analysis device of claim 1, further comprising:

an adaptor having one end connected to an outlet for an external power supply and the other end connected to a power supply cable of the treadmill and configured to supply power from the external power supply to the treadmill.

7. The analysis device of claim 1, wherein, when the object to be measured is an old person who exceeds a predetermined age or a patient with joint disease, the computer processor is configured to perform a medical diagnosis based on the movement pattern of the object to be measured.

8. The analysis device of claim 1, wherein the analysis device is driven separately from the treadmill.

* * * * *